(12) United States Patent
Li

(10) Patent No.: US 10,325,818 B2
(45) Date of Patent: Jun. 18, 2019

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 107 days.

(21) Appl. No.: 15/376,511

(22) Filed: Dec. 12, 2016

(65) Prior Publication Data
US 2017/0200656 A1    Jul. 13, 2017

(30) Foreign Application Priority Data

Jan. 7, 2016  (CN) .......................... 2016 1 0008945

(51) Int. Cl.
*H01L 21/8238*  (2006.01)
*H01L 21/225*  (2006.01)
(Continued)

(52) U.S. Cl.
CPC .. *H01L 21/823857* (2013.01); *H01L 21/0228* (2013.01); *H01L 21/02164* (2013.01);
(Continued)

(58) Field of Classification Search
CPC ......... H01L 29/66803; H01L 29/66818; H01L 29/785; H01L 29/7856; H01L 21/225; H01L 21/2251; H01L 21/845; H01L 21/2254; H01L 21/2255
See application file for complete search history.

(56) References Cited

U.S. PATENT DOCUMENTS

| 9,455,204 | B1* | 9/2016 | Cao ................. H01L 21/823892 |
| 2013/0115763 | A1* | 5/2013 | Takamure ......... H01L 21/02129 |
| | | | 438/513 |

(Continued)

FOREIGN PATENT DOCUMENTS

WO    2014204477 A1    12/2014

OTHER PUBLICATIONS

The European Patent Office (EPO) The Extended European Search Report for 16207188.0 dated Jun. 12, 2017 9 Pages.

(Continued)

*Primary Examiner* — Ermias T Woldegeorgis
(74) *Attorney, Agent, or Firm* — Anova Law Group, PLLC

(57) ABSTRACT

The present disclosure provides a method for fabricating a fin field-effect transistor (fin-FET), including: providing a substrate having a plurality of discrete fin structures thereon; forming a chemical oxide layer on at least a sidewall of a fin structure; forming a doped layer containing doping ions on the chemical oxide layer; and annealing the doped layer such that the doping ions diffuse into the fin structure to form a doped region.

19 Claims, 11 Drawing Sheets

(51) Int. Cl.
  *H01L 21/02* (2006.01)
  *H01L 21/28* (2006.01)
  *H01L 27/092* (2006.01)
  *H01L 29/66* (2006.01)
  *H01L 29/78* (2006.01)

(52) U.S. Cl.
  CPC .. *H01L 21/02238* (2013.01); *H01L 21/02321* (2013.01); *H01L 21/2251* (2013.01); *H01L 21/2254* (2013.01); *H01L 21/2255* (2013.01); *H01L 21/2256* (2013.01); *H01L 21/28185* (2013.01); *H01L 21/823821* (2013.01); *H01L 21/823892* (2013.01); *H01L 27/0924* (2013.01); *H01L 29/66795* (2013.01); *H01L 29/66803* (2013.01); *H01L 29/7851* (2013.01)

(56) References Cited

U.S. PATENT DOCUMENTS

2013/0200455 A1    8/2013  Lo et al.
2015/0079773 A1*   3/2015  Basker ............... H01L 21/18
                                              438/510
2016/0233088 A1*   8/2016  Feng ................ H01L 21/2256

OTHER PUBLICATIONS

Masayasu Miyake: Shallow Boron-Doped Layer Formation by Boron Diffusion from Poly-Si Through Thin SiO2, Journal of the Electrochemical Society vol. 141, No. 6, Jun. 1994, 7 pages.

* cited by examiner

SEMICONDUCTOR DEVICE AND FABRICATION METHOD THEREOF

CROSS-REFERENCES TO RELATED APPLICATIONS

This application claims the priority of Chinese patent application No. 201610008945.7, filed on Jan. 7, 2016, the entirety of which is incorporated herein by reference.

FIELD OF THE INVENTION

The present invention generally relates to the field of semiconductor manufacturing technology and, more particularly, relates to a semiconductor device and a fabrication method thereof.

BACKGROUND

With the development of semiconductor processing technologies, the dimensions of semiconductor process nodes continue to decrease according to Moore's law. To adapt to the decrease of semiconductor process nodes, the channel length of a MOSFET needs to be reduced continuously. A shorter channel length can provide advantages such as an increased density of semiconductor chips and an increased switching speed of the MOSFETs.

However, as the channel lengths of devices decrease, the distance between the source electrode and the drain electrode of a device is also reduced. As such, the control ability of the gate electrode over the channel is reduced, causing a subthreshold leakage phenomenon. In other words, short-channel effects (SCE) are more likely to occur.

To better adapt to the needs of proportionally scaling down device dimensions, the focus of semiconductor fabrication gradually changes from planar MOSFETs to three-dimensional transistors that have higher performance, such as fin-FETs. In a fin-FET, the gate electrode can provide control over an ultra-thin body (a fin structure) from both sides, and thus gate electrode has an increased control over the channel compared to planar MOSFET devices. Accordingly, short-channel effects may be well suppressed. Further, compared to other types of devices, fin-FETs are more compatible with the manufacturing technologies of current integrated circuits.

However, the electrical performance of fin-FETs formed by conventional technologies need to be improved.

The disclosed devices and methods are directed to solve one or more problems set forth above and other problems.

BRIEF SUMMARY OF THE DISCLOSURE

One aspect of the present disclosure provides a method for fabricating a fin field-effect transistor (fin-FET), including: providing a substrate having a plurality of discrete fin structures thereon; forming a chemical oxide layer on at least a sidewall of a fin structure; forming a doped layer containing doping ions on the chemical oxide layer; and annealing the doped layer such that the doping ions diffuse into the fin structure to form a doped region.

Another aspect of the present disclosure provides a semiconductor device fabricating a fin-FET, including: a substrate having a plurality of discrete fin structures thereon; a chemical oxide layer on at least a sidewall of a fin structure; a doped layer containing doping ions on the chemical oxide layer; and a doped region in the fin structure containing doping ions diffused from the doping ions in the doped layer.

Other aspects of the present disclosure may be understood by those skilled in the art in light of the description, the claims, and the drawings of the present disclosure.

DETAILED DESCRIPTION

Figure 1:
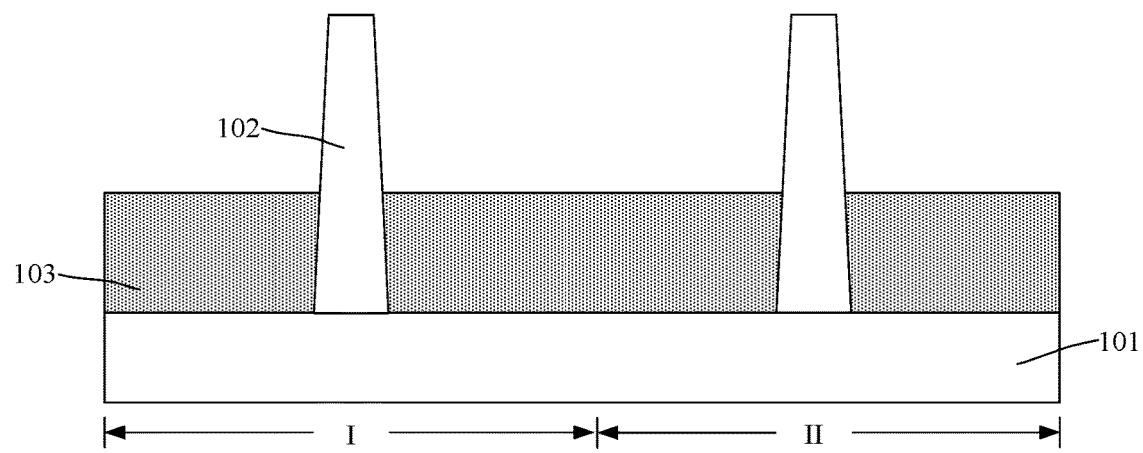
FIGS. 1-8 are cross-sectional views of an exemplary fin-FET at different stages of a fabrication process consistent with various disclosed embodiments of the present disclosure.

Reference will now be made in detail to the exemplary embodiments of the disclosed invention, which are illustrated in the accompanying drawings. Wherever possible, the same reference numbers will be used throughout the drawings to refer to the same or similar parts.

In order to improve the electrical performance of fin-FETs, the fin structures of fin-FETs are often doped. For example, a fin structure may be doped to form a lightly doped drain (LDD), or a fin structure may be doped to form an anti-punch-through region to prevent a punch-through between the source region and the drain region. Often, an ion implantation process is used for the doping process. However, an ion implantation process is likely to cause implantation damages to the surfaces of a fin, resulting in poor morphology and lattice damage on the fin. Further, an ion implantation process can implant ions into undesirable regions of the fin structure. Thus, solid source doping (SSD) method is used. Specifically, a doped layer is formed on the surface of the fin, the doped layer containing doping ions. Further, an annealing process is performed on the doped layer so that the doping ions can diffuse into the fin structure. The electrical performance of the fin-FET can thus be improved.

However, the performance of the LDD regions or the anti-punch-through regions formed by the SSD method still needs to be improved. It has been further found that, the performance of the interface between the doped layer and the fin structure can significantly impact the ability of the doping ions to diffuse into the fin structures. Because a fin structure is exposed in the outside environment before the doped layer is formed, a native oxide layer is likely to be formed on the surface of the fin structure. The native oxide layer blocks the doping ions from diffusing into the fin structure. Also, because the density of the native oxide layer is considerably high, and the diffusion of doping ions into the fin structure is hindered by the native oxide layer. Thus, the ability of the doping ions to diffuse into the fin structure is impaired. The performance of the formed fin-FETs needs to be improved.

Further, the source materials for forming the doped layer often include oxygen source gas. Because the fin structure is exposed in the environment for forming the doped layer and the oxygen source gas is often plasmarized to form oxygen plasma, the material of the oxide material formed from the contact between the oxygen plasma and the fin surface is similar to the properties of the native oxide. The layer formed by the stacking of the oxide material is referred to as a natural-oxide-like layer. The natural-oxide-like layer has a high density, causing the ability of the doping ions to diffuse into the fin structure to decrease.

To solve the aforementioned problems, the disclosed invention provides a method to improve the performance of fin-FETs. First, a substrate is provided, and isolated fin structures are formed on the substrate surface. Further, a chemical oxide layer is formed on the sidewall surface of the fin structure or on the top surface and sidewall surface of the fin structure. A doped layer is then formed on the surface of the chemical oxide layer, and doping ions are present within the doped layer. Finally, the doped layer is annealed, and doing ions are diffused into the fin structure to form the doped layer. By forming a chemical oxide layer on the fin surface, the disclosed invention avoids formation of the natural oxide layer on the fin surface. Further, the oxidation of the fin structure during the process of forming the doped layer is avoided. As a result, the diffusion interface between the doped layer and the fin structure has a good performance, and doping ions can easily diffuse into the fin structure through the chemical oxide layer. Therefore, the doping efficiency is increased, and the performance of the formed fin-FETs is improved.

To further illustrate the objectives, features, and advantages of the disclosed invention, the details of the specific embodiments of the disclosed invention are described in the following.

FIGS. 1-8 are cross-sectional views of an exemplary fin-FET at different stages of a fabrication process consistent with various disclosed embodiments of the present disclosure.

In one embodiment, the LDD region of a fin-FET is formed by the SSD method.

Figure 19:
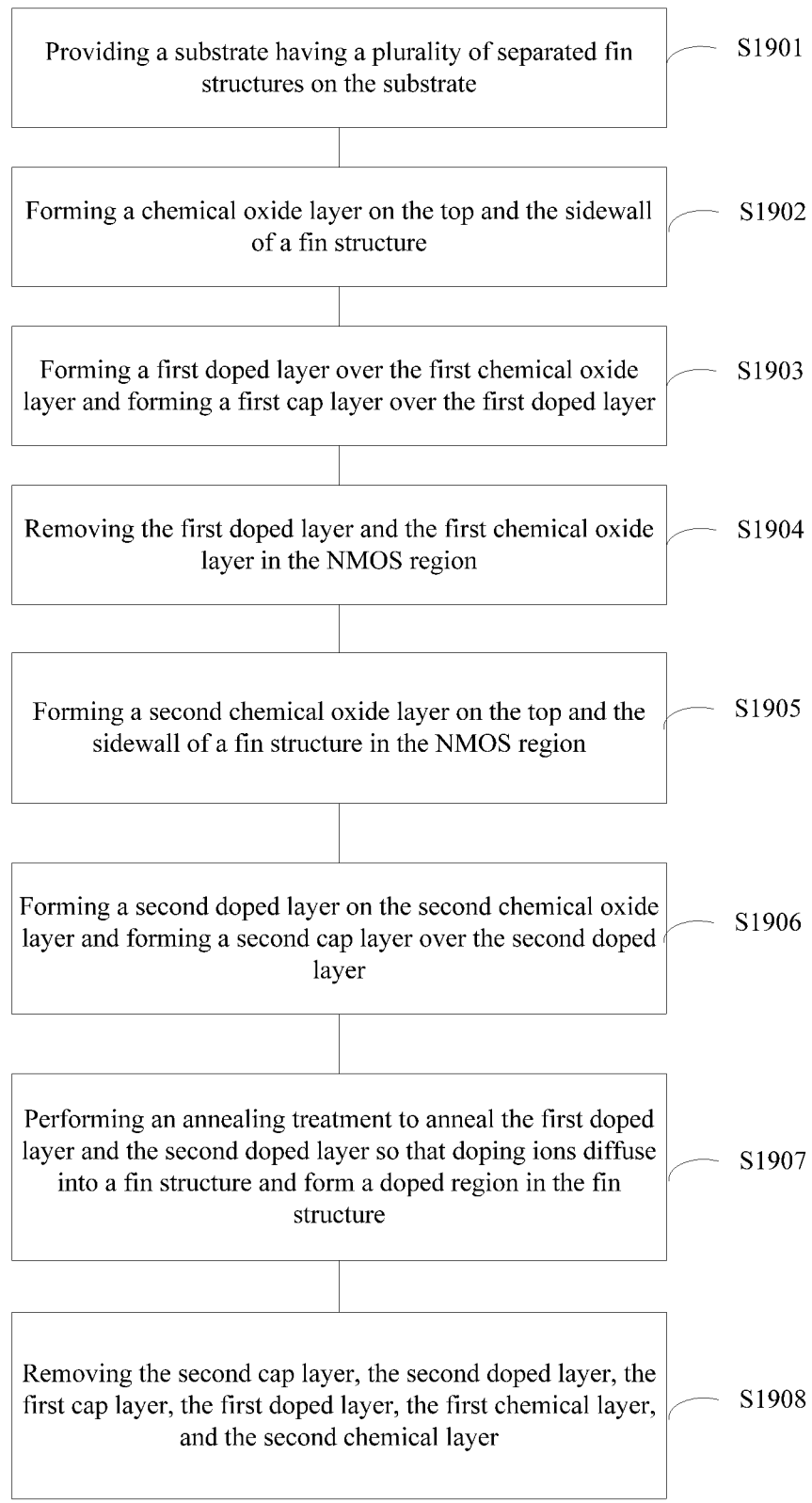
FIG. 19 illustrates a process flow of an exemplary fabrication process to form a fin-FET consistent with various disclosed embodiments of the present disclosure.

As shown in FIG. 19, at the beginning of the process, a substrate is provided. A plurality of fin structures, separated (or discrete) from each other, may be formed on the substrate (S1901). FIG. 1 illustrates a corresponding structure.

As shown in FIG. 1, a substrate 101 may be provided. A plurality of fin structures 102, separated from each other, may be formed on the substrate 101.

In one embodiment, as an example, the formed fin-FET may be a CMOS device. The substrate 101 may include a PMOS region I and an NMOS region II. A plurality of separated fin structures 102 may be formed in the PMOS region I on the substrate 101. A plurality of separated fin structures 102 may be formed in the NMOS region II on the substrate 101. The PMOS region I may be a region for forming a PMOS device, and the NMOS region II may be a region for forming an NMOS device. The PMOS region I and the NMOS region II may be adjacent to each other. In other various embodiments, the NMOS region and the PMOS region may not be adjacent to each other or may be separated by other regions/parts. In other various embodiments, the substrate 101 may also only include NMOS regions or only include PMOS regions.

The substrate 101 may be made of silicon, germanium, silicon germanium, silicon carbide, gallium arsenide, and/or indium gallium. The substrate 101 may also be made of silicon on insulator or germanium on insulator. In one embodiment, the substrate 101 may be made of silicon.

The fin structure 102 may be made of silicon, germanium, silicon germanium, silicon carbide, gallium arsenide, and/or indium gallium. In one embodiment, a fin structure 102 may be made of silicon.

In one embodiment, a fabrication process to form the substrate 101 and the fin structures 102 may include the following steps. First, an initial substrate or a base substrate may be provided. A patterned hard mask layer may be formed on the base substrate. The base substrate may be etched using the hard mask layer as the etch mask. The base substrate after the etching process may be the substrate 101, and the protrusion structures on the substrate 101 may be the fin structures 102. In one embodiment, the top dimension of a fin structure 102 may be smaller than the bottom dimension of the fin structure 102. In some other embodiments, the top dimension of a fin structure 102 may be the same as the bottom dimension of the fin structure 102.

In one embodiment, a fabrication process to form the hard mask layer may include the following steps. First an initial hard mask film or a base hard mask film may be formed. A patterned photoresist layer may be formed on the base hard mask film. Further, the base hard mask film may be etched using the patterned photoresist layer as the etch mask to form a hard mask layer on the base substrate. Further, the patterned photoresist layer may be removed. In other embodiments, the fabrication process for forming the hard mask layer may also include a self-aligned double patterning (SADP) process, a self-aligned triple patterning process and/or a self-aligned double double patterning process. The double patterning process may include a litho-etch-litho-etch (LELE) or a litho-litho-etch (LLE) process.

As shown in FIG. 1, the fabrication process to form disclosed structure may further include forming an insulation layer 103 on the substrate 101. The insulation layer 103 may cover a portion of the sidewall of a fin structure 102. The top of the insulation layer 103 may be lower than the top of a fin structure 102. The insulation layer 103 may provide electrical insulation between adjacent fin structures 102. The insulation layer 103 may be made of silicon oxide and/or silicon oxynitride. In one embodiment, the fabrication process to form the insulation layer 103 may include the following steps. First an insulation film may be formed on the substrate 101. The top of the insulation film may be higher than the top of a fin structure 102. A polishing process may be performed to remove the portion of the insulation film that is higher than the top of the fin structures 102. Further, an etch back process may be performed to remove a portion of the total thickness of the insulation film to exposed a portion of the sidewall of a fin structure 102. The insulation layer 103 may be formed.

The fabrication process to form the disclosed structure may further include forming a first gate structure (not shown) in the PMOS region I on the substrate 101. The subsequently-formed P-type doped regions may be located in the substrate 101 on the two sides of the first gate structure. The fabrication process may further include forming a second gate structure (not shown) in the NMOS region II on the substrate 101. Specifically, in one embodiment, a first gate structure may be formed on the insulation layer 103 in the PMOS region I. The first gate structure may be laterally across a fin structure 102 in the PMOS region I and may cover a portion of the top and sidewall of the fin structure 102. The subsequently-formed P-type doped region may be located in the fin structure 102, in the PMOS region and on the two sides of the first gate structure. A second gate structure may be formed on the insulation layer 103 in the NMOS region II. The second gate structure may be laterally across a fin structure 102 in the NMOS region II and may cover a portion of the top and sidewall of the fin structure 102 in the NMOS region II. The subsequently-formed N-type doped region may be located in the fin structure 102 in the NMOS region and on the two sides of the second gate structure.

Figure 2:
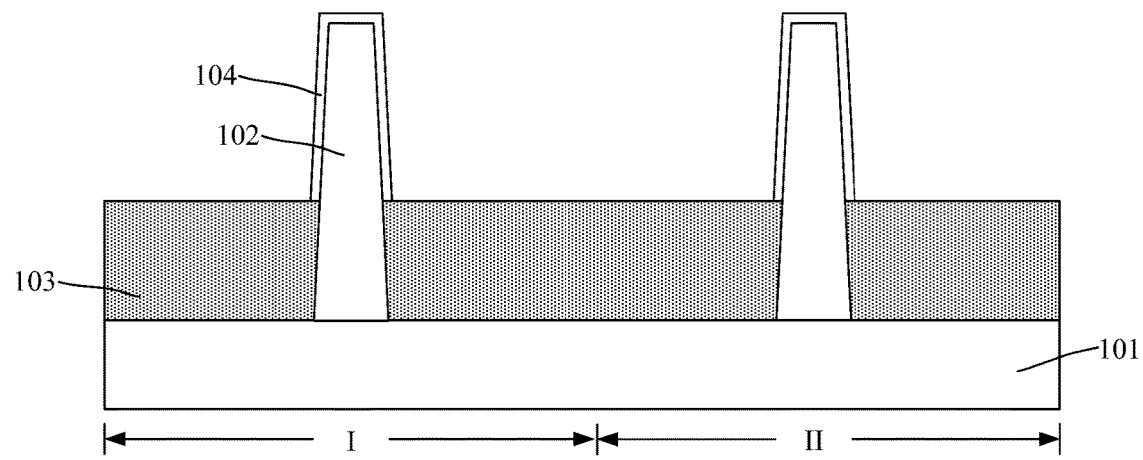

Referring to FIG. 19, after the substrate 101 with the fin structures 102 is provided, a chemical oxide layer is formed over the top and the sidewall of a fin structure (S1902). FIG. 2 illustrates a corresponding structure.

As shown in FIG. 2, a chemical oxide layer 104 may be formed over the top and the sidewall of a fin structure 102.

Specifically, in one embodiment, the chemical oxide layer may be a first chemical oxide layer 104 located over the top and the sidewall of a fin structure 102 in the PMOS region I. The first chemical oxide layer 104 may also be located over the top and the sidewall of a fin structure 102 in the NMOS region II. The first chemical oxide layer 104 may be located over the top and the sidewall of a fin structure that is higher than the insulation layer 103.

In one embodiment, the first chemical oxide layer 104 may be formed using a chemical oxidation process. The first chemical oxide layer 104 may be made of silicon oxide.

In one embodiment, the process for forming the first chemical oxide layer 104 may include infiltrating a fin structure 102 with a mixed solution of sulfuric acid and hydrogen peroxide. The temperature for the infiltration process may range from about 120° C. and to 180° C. A ratio of the volume of the sulfuric acid to the volume of the hydrogen peroxide may range from about 1:1 to about 5:1.

In another embodiment, the process for forming the first chemical oxide layer 104 may include infiltrating a fin structure 102 with a mixed solution of ammonia and hydrogen peroxide. The temperature of the infiltration process may range from about 25° C. to about 45° C. A ratio of the volume of the ammonia to the volume of the hydrogen peroxide may range from about 1:4 to about 1:25.

The first chemical oxide layer 104 formed by a chemical oxidation process may a desirably moderate density. Accordingly, the first chemical oxide layer 104 may prevent the oxygen from the outside environment from contacting the fin structures 102 so as to prevent the formation of natural oxide on the top and the sidewalls of a fin structure 102. Further, the first chemical oxide layer 104 may allow the doping ions in the subsequently-formed first doped layer to diffuse into a fin structure 102 in the PMOS region I through the first chemical oxide layer 104. The first chemical oxide layer 104 may have a desirably weak blocking effect on the diffusion of doping ions, so that a desirably a large number of doping ions in the first doped layer may diffuse into a fin structure 102 in the PMOS region I.

If no first chemical oxide layer is formed over a fin structure 102 in the PMOS region I, the fin structure 102 in the PMOS region I may be exposed to the outside environment for a certain amount of time before subsequently forming the first doped layer. The oxygen in the outside environment may contact a fin structure 102 in the PMOS region I and further cause the surface of the fin structure 102 to be easily oxidized. Accordingly, a natural oxide will form on the fin structure 102 in the PMOS region. The natural oxide may have an undesirably high density and may have an undesirably strong blocking effect on the diffusion of doping ions in the subsequently-formed first doped layer. As a result, the number of doping ions diffuse into the fin structure 102 may be undesirably small.

If the first chemical oxide layer 104 is too thin, the oxygen from the outside environment may still diffuse to the surface of a fin structure 102 through the first chemical oxide layer 104, causing the formation of natural oxide on the sidewall of the fin structure 102 in the PMOS region I. If the first chemical oxide layer 104 is too thick, the diffusion path of the subsequent doping ions when diffusing through the first chemical layer 104 into the fin structure 102 may be too long. Also, the time required to remove the first chemical oxide layer 104, e.g., by etching, may be too long, which may cause an undesirably amount of the insulation layer 103 to be etched away.

Based on the abovementioned considerations, in one embodiment, the thickness of the first chemical oxide layer 104 may range from about 0.5 nm to about 3 nm.

Before forming the first chemical oxide layer 104, the process to form the disclosed structure may further include cleaning and/or rinsing a fin structure 102 to remove the impurities on the surface of a fin structure 102. The natural oxide on the surface of a fin structure 102 may also be etched and removed. In one embodiment, hydrofluoric acid solution may be used for the cleaning and rinsing process.

Figure 3:
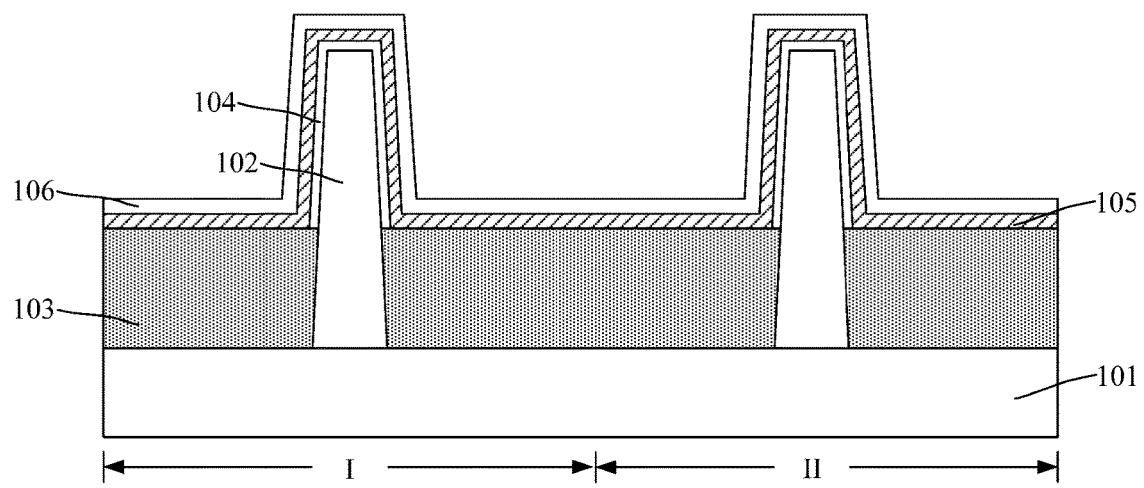

Referring to FIG. 19, after the first chemical oxide layer is formed, a first doped layer is formed over the first chemical oxide layer and a first capping layer is formed over the first doped layer (S1903). FIG. 3 illustrates a corresponding structure.

As shown in FIG. 3, a first doped layer 105 may be formed over the first chemical oxide layer 104.

In one embodiment, the first doped layer 105 may be over the insulation layer 103. The first doped layer 105 in the NMOS region II may be subsequently removed through etching. The first doped layer 105 may contain P-type doping ions. The P-type doping ions in the first doped layer 105 in the PMOS region I may diffuse into a fin structure 102 in the PMOS region I to form a P-type lightly doped region in a fin structure 102 in the PMOS region I.

The first doped layer 105 may be made of an insulating material, so that the first doped layer 105 has little or no impact on the feature size of a fin structure 102. Further, the first layer 105 may be made of a material that can be easily removed, and the process to remove the material of the first doped layer 102 causes little or no damage to a fin structure 102.

The source material for forming the first doped layer 105 may include an oxygen source gas, such as $O_2$ and/or $H_2O$ vapor.

Given the abovementioned considerations, the first doped layer 105, doped with P-type doping ions, may be made of silicon oxide, silicon oxynitride, silicon oxycarbide, and/or silicon oxycarbonitride. In one embodiment, the first doped layer 105 may be made of silicon oxide doped with P-type doping ions. The P-type doping ions may include boron, gallium and/or indium. In one embodiment, the first doped layer 105 may be boron-doped silicon oxide. The boron concentration in the first doped layer 105 may be about 1E20 atom/cm$^3$ to about 1E21 atom/cm$^3$. In other embodiments, the concentration of the doping ions in the first doped layer 105 may be determined according to requirements of different fabrication processes.

The first doped layer 105 may be formed through a chemical vapor deposition process, a physical vapor deposition process and/or an atomic layer deposition process. In the one embodiment, the first doped layer 105 may be formed through an atomic layer deposition process with in-situ doping. The P-type doping ions are uniformly distributed in the first doped layer 105 so that the concentration of the P-type doping ions in the first doped layer 105 may be desirably uniform. The first doped layer 105 may have a desirably strong ability to cover a step-shaped feature. The first doped layer 105 may have a desirably uniform thickness so that the concentration of the P-type doping ions, diffusing into various parts of a fin structure 102 in the PMOS region I, may be relatively uniform in various parts of the fin structure 102.

Because the first chemical oxide layer 104 is formed over a fin structure 102, the surface of a fin structure 102 is not exposed to the environment for forming the first doped layer 105. Thus, a fin structure 102 has little or no contact with the oxygen source gas for forming the first doped layer 105. Formation of an oxide material, on a fin structure 102, may be prevented.

In one embodiment, the thickness of the first doped layer 105 may range from about 2 nm to about 10 nm. The thickness of the first doped layer 105 in the disclosure should not be limited by the embodiments of the present disclosure. In other embodiments, the thickness of the first doped layer 105 should be determined according to the requirements of different fabrication processes.

Referring to FIG. 3, a first capping layer 106 may be formed over the first doped layer 105.

The material density of the first capping layer 106 may be higher than the material density of the first doped layer 105. The effect of the first capping layer 106 may be illustrated as follows. First, when subsequently annealing the first doped layer 105, because of the blocking effect of the first capping layer 106, more and more doping ions in the first doped layer 105 may diffuse into a fin structure 102 in the PMOS region I as much as possible. Further, a second doped layer may be subsequently formed in the NMOS region II and the second doped layer may be formed over the first capping layer 106 in the PMOS region I, the first capping layer 106 may separate the first doped layer 105 and the second doped layer, and prevent the doping ions in the second doped layer from diffusing into the first doped layer 105. Thus, before the annealing process, it may not be necessary to etch and remove the second doped layer in the PMOS region I. Accordingly, less fabrication steps may be used, and the number of masks used in the fabrication process may be reduced.

In one embodiment, the first capping layer 106 may be made of silicon nitride. To provide sufficient blocking effect, by the first capping layer 106, for the doping ions in the first doped layer 105, and to provide sufficiently blocking effect, the first capping layer 106, for the subsequently-formed second doped layer, the thickness of the first capping layer 106 may not be too small. Meanwhile, to remove the first capping layer 106 through etching in a desirably short time, the thickness of the first capping layer 106 may not be too large. Thus, in one embodiment, the thickness of the first capping layer 106 may range from about 5 nm to about 20 nm.

Figure 4:
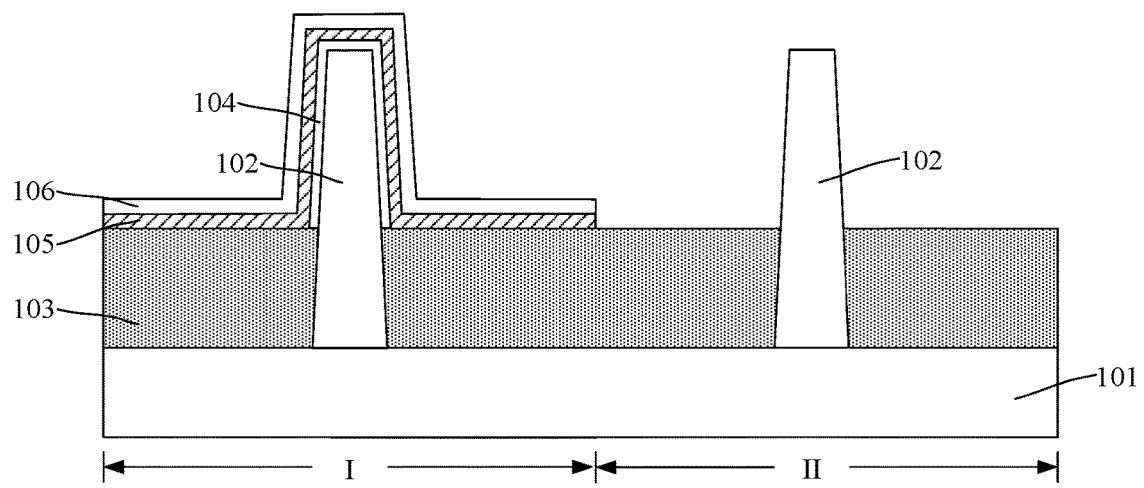

Referring to FIG. 19, after the first doped layer and the first capping layer are formed, the first doped layer and the first chemical oxide layer in the NMOS region II may be removed through an etching process (S1904). FIG. 4 illustrates a corresponding structure.

As shown in FIG. 4, the first doped layer 105 and the first chemical oxide layer 104 in the NMOS region II may be removed through an etching process.

Before removing the first doped layer 105 and the first chemical oxide layer 104 in the NMOS region II through an etching process to form the disclosed structure may include removing the first capping layer 106 in the NMOS region II through an etching process.

In one embodiment, a first patterned layer may be formed over the first capping layer 106 in the PMOS region I. The first patterned layer may be used as the mask to remove the first capping layer 106, the first doped layer 105, and the first chemical oxide layer 104 in the first NMOS region II through the etching process. Further, the first patterned layer may be removed.

One or more of a dry etching process, a wet etching process, and a SiCoNi etching process may be used to remove the first doped layer 105 and the first chemical oxide layer 104 in the NMOS region II.

Figure 5:
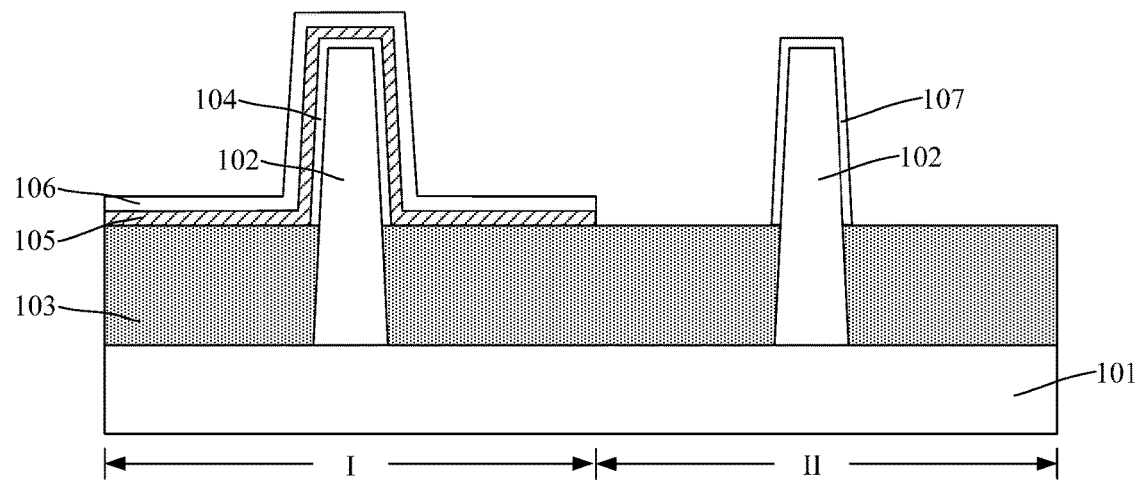

Referring to FIG. 19, after the first doped layer and the first chemical oxide layer in the NMOS region II are removed, a second chemical oxide layer may be formed on the top and the sidewall of a fin structure in the NMOS region II (S1905). FIG. 5 illustrates a corresponding structure.

As shown in FIG. 5, a second chemical oxide layer 107 may be formed on the top and the sidewall of a fin structure 102 in the NMOS region II.

In one embodiment, the second chemical oxide layer 107 may be formed on the top and the sidewall of a fin structure 102 in the NMOS region II. The fin structure 102 may be higher than the insulation layer 103.

The fabrication process and material to form the second chemical oxide layer 107, and the effect of the second chemical oxide layer 107 may be referred to the description of the first chemical oxide layer 104, and are not repeated herein.

In one embodiment, the second chemical oxide layer 107 may be made of silicon oxide, and the thickness of the second chemical oxide layer may range from about 0.5 nm to about 3 nm.

Figure 6:
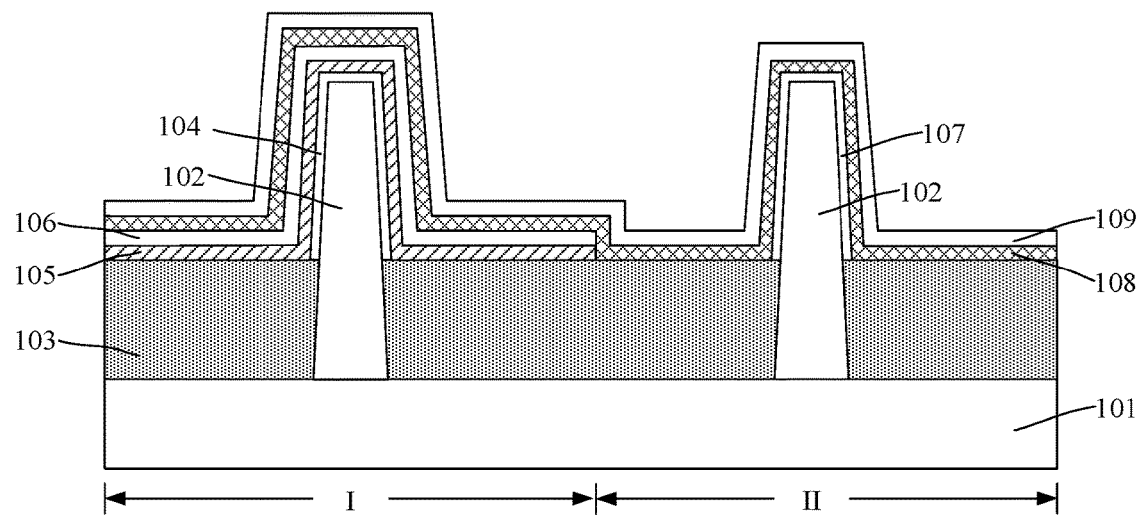

Referring to FIG. 19, after forming the second chemical oxide layer, a second doped layer is formed on the second chemical oxide layer and a second capping layer is formed over the second doped layer (S1906). FIG. 6 illustrates a corresponding structure.

As shown in FIG. 6, a second doped layer 108 may be formed on the second chemical oxide layer 107.

In one embodiment, the second doped layer 108 may also be over the insulation layer 103, and be over the first capping layer 106 in the PMOS region I. The first capping layer 106 may separate the first doped layer 105 from the second doped layer 108.

The second doped layer 108 may be doped with N-type doping ions. The N-type doping ions in the second doped layer 108 in the NMOS region II may diffuse into a fin structure 102 in the NMOS region II to form an N-type lightly doped region in a fin structure 102 in the NMOS region II.

The second doped layer 108 may be formed using an oxygen source gas, such as $O_2$ and/or $H_2O$ vapor.

The second doped layer 108 may be made of an insulating material so that the second doped layer 108 may have little or no impact on the feature size of a fin structure 102. Further, the second doped layer 108 may also be made of a material that can be easily removed, and the fabrication process to remove the material of the second doped layer 108 may cause little or no damage to a fin structure 102.

The second doped layer 108 may be made of silicon oxide, silicon oxynitride, silicon oxycarbide, or silicon oxycarbonitride, doped with N-type doping ions. In one embodiment, the second doped layer 108 may be made of silicon oxide doped with N-type doping ions. The N-type doping ions may include phosphorous ions, arsenic ions, and/or antimony ions. In one embodiment, the second doped layer 108 may be made of silicon oxide doped with phosphorous ions. The concentration of the phosphorous ions in the second doped layer 108 may range from about 1E21 atom/$cm^3$ to about 5E22 atom/$cm^3$.

The second doped layer 108 may be formed using one or more of a chemical vapor deposition process, a physical vapor deposition process, and an atomic layer deposition process. In one embodiment, the second doped layer 108 may be formed using an atomic layer deposition process with in-situ doping so that the N-type doping ions in the second doped layer 108 may have a desirably uniform concentration. The second doped layer 108 may have a desirably strong ability to cover a step-shaped feature. The thickness of the second doped layer 108 may have a desired uniformity so that the concentration of N-type doping ions, diffusing into various parts of a fin structure 102 in the NMOS region II, may be relatively uniform in various parts of the fin structure 102.

In one embodiment, the thickness of the second doped layer 108 may range from about 2 nm to about 10 nm. The thickness of the second doped layer 108 should not be limited by the embodiments of the present disclosure. In other embodiments, the thickness of the second doped layer may be determined according to actual fabrication requirements.

Referring to FIG. 6, a second capping layer 109 may be formed over the second doped layer 108.

The material density of the second capping layer 109 may be higher than the material density of the second doped layer 108. The material to form the second capping layer 109 and the effect of the second capping layer 109 may be referred to the description of the first capping layer 106 and are not repeated herein.

In one embodiment, the second capping layer 109 may be made of silicon nitride, and the thickness of the second capping layer may range from about 5 nm to about 20 nm.

Figure 7:
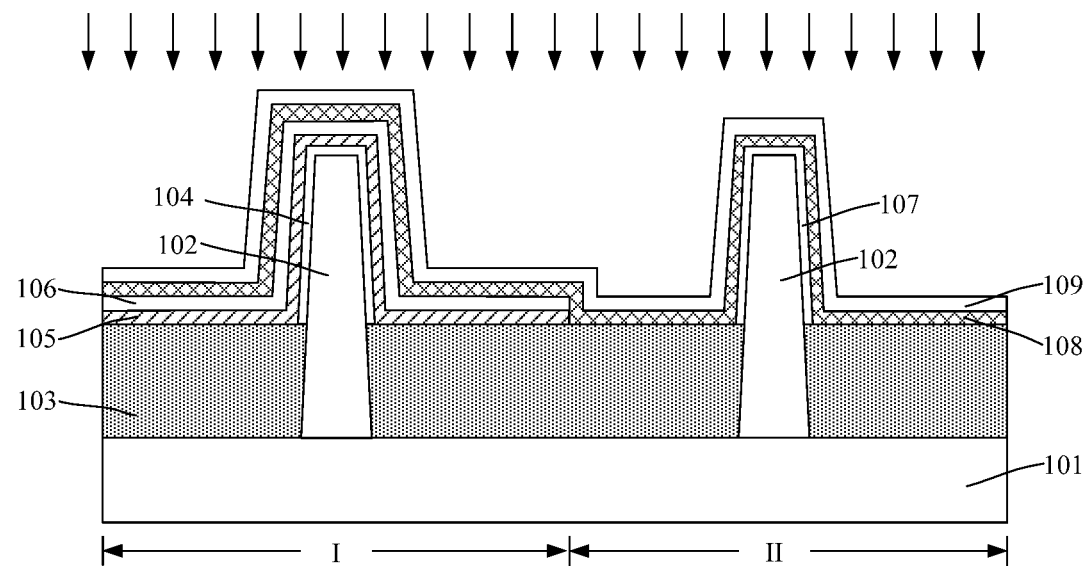

Referring to FIG. 19, after forming the second doped layer and the second capping layer, an annealing treatment is performed to anneal the first doped layer and the second doped layer so that doping ions diffuse into a fin structure and form a doped region in the fin structure (S1907). FIG. 7 illustrates a corresponding structure.

As shown in FIG. 7, an annealing treatment/process, indicated by the arrows in FIG. 7, may be performed to anneal the first doped layer 105 and the second doped layer 108 so that doping ions may diffuse into a fin structure 102 and form a doped region in the fin structure 102.

In one embodiment, the doped regions may include the P-type doped region (not shown) in a fin structure 102 in the PMOS region I and the N-type doped region (not shown) in a fin structure 102 in the NMOS region II. Specifically, a same annealing process may be performed to diffuse the P-type doping ions in the first doped layer 105 into a fin structure 102 in the PMOS region I to form a P-type doped region, and diffuse the N-type doping ions in the second doped layer 108 into a fin structure 102 in the NMOS region II to form a N-type doped region.

In one embodiment, a rapid thermal annealing process is performed as the annealing process. The annealing temperature may range from about 1000° C. to about 1150° C., and the annealing time may range from about 1 second to about 10 seconds.

Because of the blocking effect of the first chemical oxide layer 104 and the second chemical oxide layer 107, no natural oxide may be formed on the fin structures 102 in the PMOS region I and in the NMOS region II. Thus, P-type doping ions in the first doped layer 105 may easily diffuse into a fin structure 102 in the PMOS region I through the first chemical oxide layer 104, and N-type doping ions in the second doped layer 108 may easily diffuse into a fin structure 102 in the NMOS region II through the second chemical oxide layer 107. Further, compared to the blocking ability of a natural oxide layer for P-type doping ions and/or N-type doping ions, the blocking ability of the first chemical oxide layer 104 for the P-type doping ions may be sufficiently weak and can be neglected. Also, the blocking ability of the second chemical oxide layer 107 for the N-type doing ions may be sufficiently weak and can be neglected. Thus, the performance of the diffusion interface between the first doped layer 105 and a fin structure 102 in the PMOS region I may be improved, and the performance of the diffusion interface between the second doped layer 108 and a fin structure 102 in the NMOS region may be improved. Accordingly, the concentrations of the doping ions in the N-type doped region and the P-type doped region may be closer to the targeted concentrations. The doping efficiencies in the N-type doped region and the P-type doped region may be improved, and the performance of the formed fin-FET may be improved.

Further, in the disclosed embodiment, the oxidation of a fin structure 102 in the PMOS region I by the fabrication process to form the first doped layer 105 may be avoided. Correspondingly, the P-type doing ions in the first doped layer 105 may diffuse into a fin structure 102 in the PMOS region I more easily. Further, the oxidation of a fin structure 102 in the NMOS region II by the fabrication process to form the second doped layer 108 may be avoided. Correspondingly, the N-type doing ions in the second doped layer 108 may diffuse into a fin structure 102 in the NMOS region II more easily.

In other embodiments, the second capping layer and the second doped layer in the PMOS region may be removed through an etching process before the annealing process. In one embodiment, as an example, the first doped layer 105 may be formed first and the second doped layer 108 may be formed later. In some other embodiments, the second doped layer may be formed first and the first doped layer may be formed later.

Figure 8:
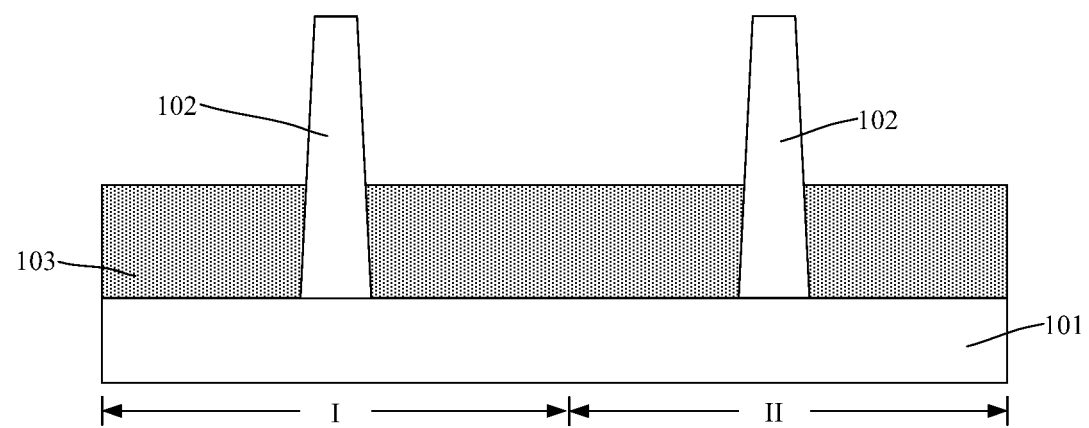

Referring to FIG. 19, after the annealing process, the second capping layer, the second doped layer, the first capping layer, the first doped layer, the first chemical oxide layer, and the second chemical oxidation layer are removed through an etching process (S1908). FIG. 8 illustrates a corresponding structure.

As shown in FIG. 8 and referring to FIG. 7, the second capping layer 109, the second doped layer 108, the first capping layer 106, the first doped layer 105, the first chemical oxide layer 104, and the second chemical oxidation layer 107 may be removed through an etching process.

In one embodiment, the second capping layer 109, the second doped layer 108, the first capping layer 106, the first doped layer 105, the first chemical oxide layer 104, and the second chemical oxide layer 107 may be removed through a wet etching process.

Another aspect of the present disclosure provides a method for improving the performance of a fin-FETs is. As an example, a solid source doping process may be used to form the anti-punch-through region of the fin-FET.

FIGS. 9-18 are cross-sectional views of an exemplary fin-FET at different stages of another fabrication process consistent with various disclosed embodiments of the present disclosure.

Figure 9:
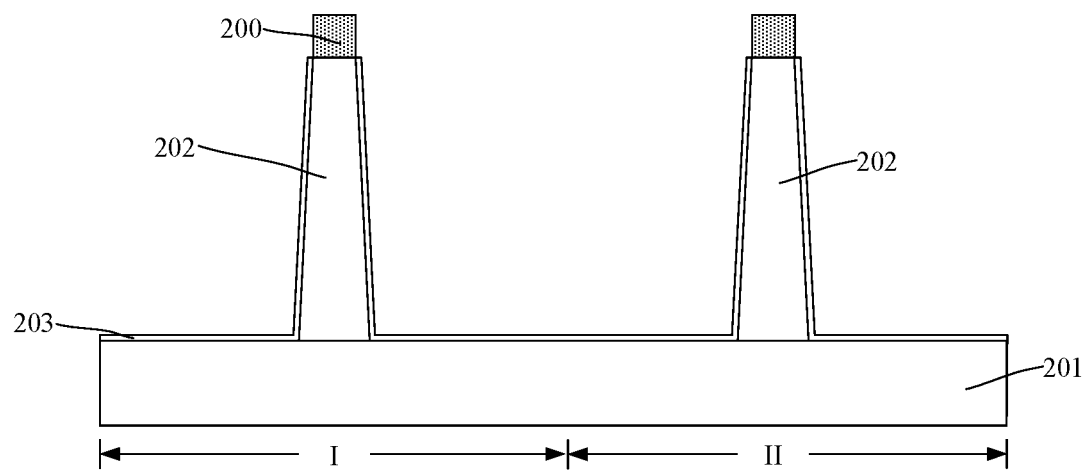
FIGS. 9-18 are cross-sectional views of another exemplary fin-FET at different stages of another fabrication process consistent with various disclosed embodiments of the present disclosure.
Figure 20:
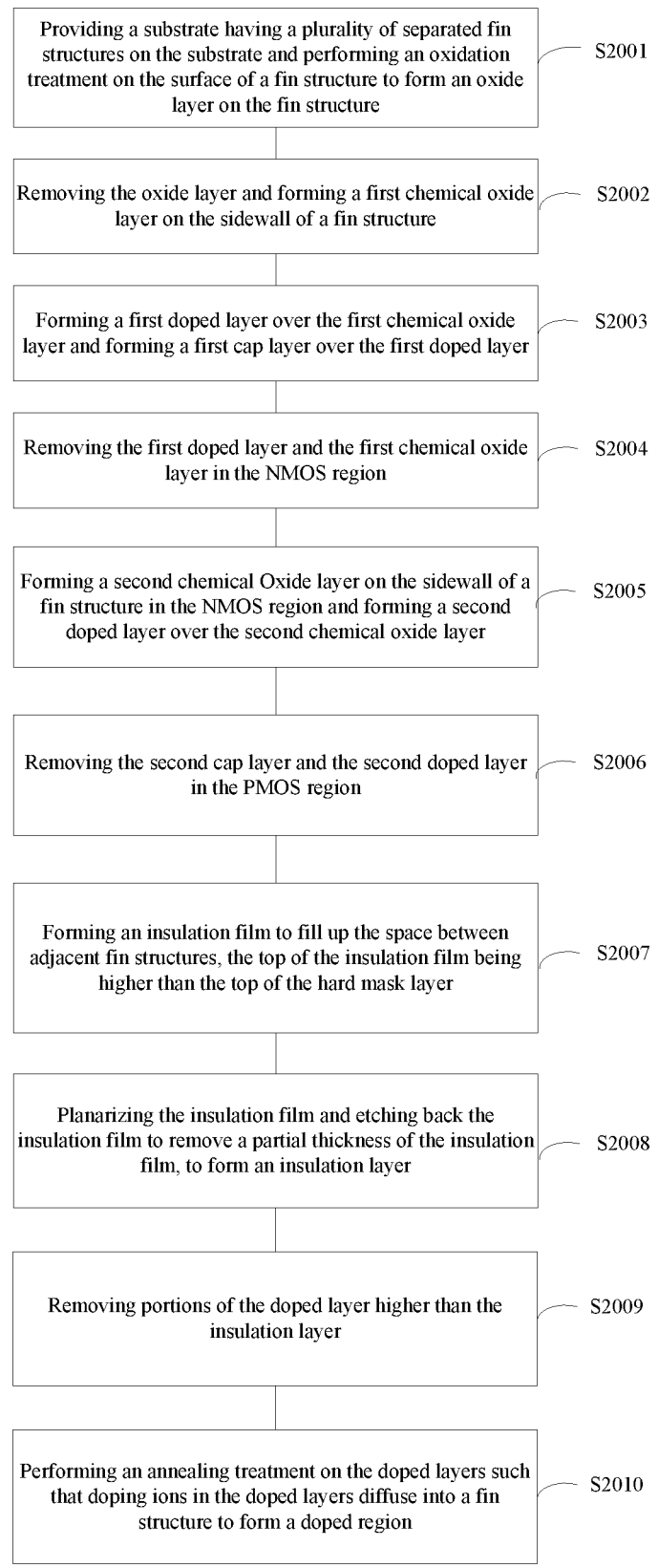
FIG. 20 illustrates a process flow of another exemplary fabrication process to form another exemplary fin-FET consistent with various disclosed embodiments of the present disclosure.

As shown in FIG. 20, at the beginning of the process, a substrate is provided. A plurality of fin structures, separated from each other, are formed on the substrate. An oxidization treatment is performed on the surface of a fin structure to form an oxide layer on the fin structure (S2001). FIG. 9 illustrates a corresponding structure.

As shown in FIG. 9, a substrate 201 may be provided. A plurality of fin structures 202, separated from each other, may be formed on the substrate 201.

In one embodiment, as an example, the formed fin-FET may be a CMOS device. The substrate 201 may include a PMOS region I and an NMOS region II. A plurality of separated fin structures 202 may be formed in the PMOS region I on the substrate 201. A plurality of separated fin structures 202 may be formed in the NMOS region II on the substrate 201. The PMOS region I may be a region for forming a PMOS device, and the NMOS region II may be a region for forming an NMOS device. The PMOS region I and the NMOS region II may be adjacent to each other. In other various embodiments, the NMOS region and the PMOS region may not be adjacent to each other or may be separated by other regions/parts. In other various embodiments, the substrate 201 may also only include NMOS regions or only include PMOS regions.

The description of the substrate 201 and the fin structures 202 may be referred to the description in the previous embodiment and is not repeated herein.

In one embodiment, after forming the fin structures 202, the hard mask layer 200 on the top a fin structure 202 may be retained. The hard mask layer 200 may be made of silicon nitride. In the following planarization process, the top surface of the hard mask layer 200 may be used as a stop position for the planarization process, and the fin structures 202 may be protected.

Referring to FIG. 9, an oxidization treatment may be performed on the surface of a fin structure 202 to form an oxide layer 203 on the fin structure 202. Because the fin structures 202 are formed by etching the base substrate, sharp protruding corners and/or surface defects may often be formed on a fin structure 202. The protruding sharp corners and/or surface defects may affect device performance when the fin-FET is subsequently formed. Thus, an oxidization treatment may be performed on the fin structures 202 to form the oxide layer 203. In the oxidation process, because the specific surface area (SSA) of a protruding corner of the fin structure 202 is greater, the protruding corer may be easier to oxidize. After subsequently removing the oxide layer 203, the surface defects and the protruding corners may be removed from a fin structure 202. This fin structure 202 may thus have a desirably smooth surface, and the lattice quality may be improved. Point discharge problem caused by the protruding corners on a fin structure 202 may be avoided, and the performance of the fin-FET may be improved.

The oxidation treatment may include an oxygen plasma oxidation process, and/or an oxidation process using a mixed solution of sulfuric acid and hydrogen peroxide. The oxidation treatment may also oxidize the substrate 201 so that the oxide layer 203 may also be on the surface of the substrate 201.

In one embodiment, the fin structures 202 may be oxidized through an in-situ stream generation (ISSG) process, to form the oxide layer 203. Because the fin structures 202 are made of silicon, the oxide layer 203 may be made of silicon oxide correspondingly.

Figure 10:
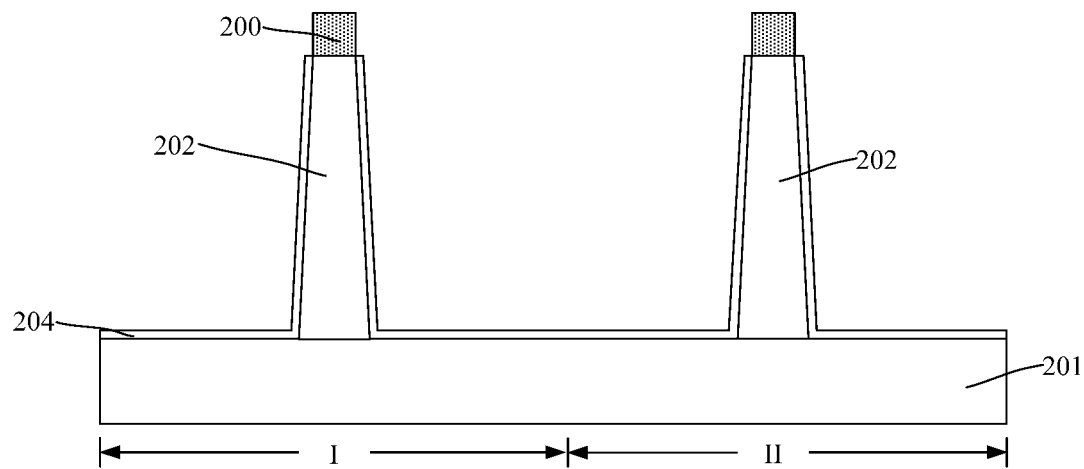

Referring to FIG. 20, after the substrate is provided, the oxide layer is removed and a first chemical oxide layer is formed on the sidewall of a fin structure (S2002). FIG. 10 illustrates a corresponding structure.

As shown in FIG. 10, the oxide layer 203 (referring to FIG. 9) may be removed and a first chemical oxide layer 204 may be formed on the sidewall of a fin structure 202.

A wet etching process may be used to remove the oxide layer 203. In one embodiment, the oxide layer 203 may be made of silicon oxide. The etching solution for the wet etching process may include hydrofluoric acid solution.

After removing the oxide layer 203, the lattice quality on the surface of a fin structure 202 may be improved, and the corners of a fin structure 202 may be smoother. Point discharge problem by a fin structure 202 may be avoided.

In one embodiment, the first chemical oxide layer 204 may be positioned on the sidewall of a fin structure 202 in the PMOS region I, on the sidewall of a fin structure 202 in the NMOS region II, and on the substrate 201.

The first chemical oxide layer 204 may be made of silicon oxide. The thickness of the first chemical oxide layer may range from about 0.5 nm to about 3 nm. The first chemical oxide layer 204 may be formed through a chemical oxidation process. Detailed description of the formation of the first chemical oxide layer 204 may be referred to the previous embodiment and is not repeated herein.

Figure 11:
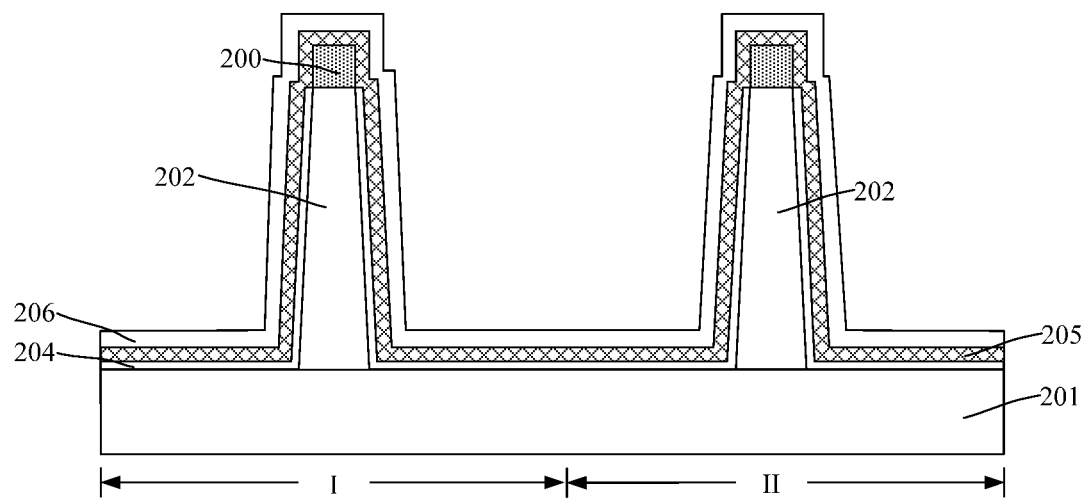

Referring to FIG. 20, after forming the first chemical oxide layer, a first doped layer is formed over the first chemical oxide layer, and a first capping layer is formed over the first doped layer (S2003). FIG. 11 illustrates a corresponding structure.

As shown in FIG. 11, a first doped layer 205 may be formed over the first chemical oxide layer 204, and a first capping layer 206 may be formed over the first doped layer 205.

The first doped layer 205 in the NMOS region II may be subsequently removed through an etching process. The first doped layer 205 may be doped with N-type doping ions. The N-type doping ions in the first doped layer 205 in the PMOS regions I may diffuse into a fin structure 202 in the PMOS region I. An N-type anti-punch-through region may be formed in a fin structure 202 in the PMOS region I.

The source material for forming the first doped layer 205 may include an oxygen source gas. The first doped layer 205 may be made of an insulating material. In one embodiment, the first doped layer 205, doped with N-type doping ions, may be made of silicon oxide, silicon oxynitride, silicon oxycarbide, and/or silicon oxycarbonitride. In one embodiment, the first doped layer 205 may be made of silicon oxide doped with N-type doping ions. The N-type doping ions may include phosphorous ions, arsenic ions, and/or antimony ions. In one embodiment, the first doped layer 205 may be made of silicon oxide doped with phosphorous ions. The concentration of the phosphorous ions in the first doped layer 205 may range from about 1E20 atom/cm$^3$ to about 1E21 atom/cm$^3$. In other embodiments, the concentration of the doping ions in the first doped layer 205 may be determined according to requirements of different fabrication processes.

The first doped layer 205 may be formed through a chemical vapor deposition process, a physical vapor deposition process and/or an atomic layer deposition process. In the one embodiment, the first doped layer 205 may be formed through an atomic layer deposition process with in-situ doping. The N-type doping ions are uniformly distributed in the first doped layer 205 so that the concentration of the N-type doping ions in the first doped layer 205 may be desirably uniform. The first doped layer 205 may have a desirably strong ability to cover a step-shaped feature. The first doped layer 205 may have a desirably uniform thickness so that the concentration of the N-type doping ions, diffusing into various parts of a fin structure 202 in the PMOS region I, may be relatively uniform at various parts of the fin structure 202.

In the process of forming the first doped layer 205, the first chemical oxide layer 204 may prevent a fin structure 202 from exposing in the environment of forming the first doped layer 205. Thus, formation of a natural-oxide-like layer, with an undesirably high density on a fin structure 202, may be avoided.

In one embodiment, the thickness of the first doped layer 205 may range from about 2 nm to about 10 nm. The thickness of the first doped layer 205 in the disclosure should not be limited by the embodiments of the present disclosure. In other embodiments, the thickness of the first doped layer 205 should be determined according to the requirements of different fabrication processes.

Detailed description of the first capping layer 206 may be referred to the description in the previous embodiment, and is not repeated herein. In one embodiment, the first capping layer 206 may be made of silicon nitride.

In one embodiment, to form an insulation layer with a desired filling ability and a processing window sufficiently large to subsequently form the insulation layer, the first capping layer 206 may not be too thick. The thickness of the first capping layer 206 may range from about 5 nm to about 15 nm.

Figure 12:
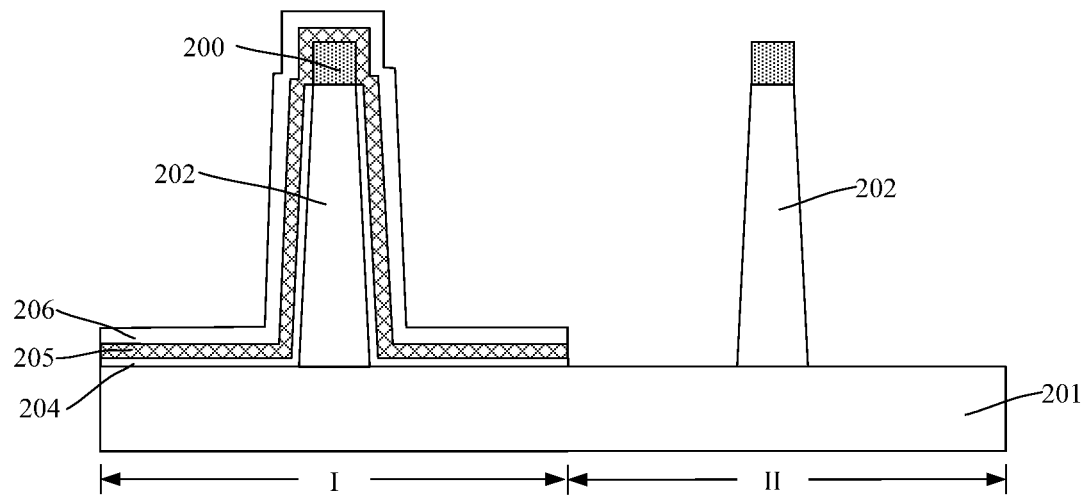

Referring to FIG. 20, after forming the first doped layer 205 and the first chemical oxide layer 204, the first doped layer and the first chemical oxide layer in the NMOS region II are removed through an etching process (S2004). FIG. 12 illustrates a corresponding structure.

As shown in FIG. 12, the first doped layer 205 and the first chemical oxide layer 204 in the NMOS region II may be removed through an etching process.

Before etch removing the first doped layer 205 and the first chemical oxide layer 204 in the NMOS region II, the fabrication process to form the disclosed structure may further include removing the first capping layer 206 in the NMOS region II through an etching process.

In an embodiment, a first patterned layer may be formed over the first capping layer 206 in the PMOS region I. The first patterned layer may be used as a mask to etch and remove the first capping layer 206, the first doped layer 205 and the first chemical oxide layer 204 in the first NMOS region II. Further, the first patterned layer may be removed.

One or more of a dry etching process, a wet etching process and a SiCoNi etching process may be used to etch and remove the first doped layer 205 and the first chemical oxide layer 204 in the NMOS region II.

Figure 13:
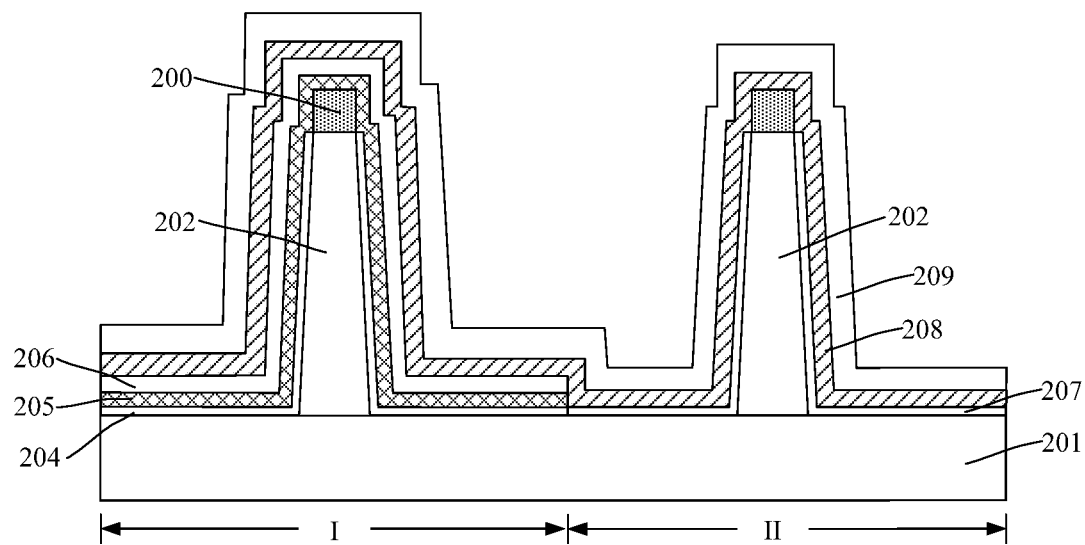

Referring to FIG. 20, after removing the first capping layer 206, the first doped layer 205 and the first chemical oxide layer 204 in the first NMOS region II, a second chemical oxide layer is formed on the sidewall of a fin structure in the NMOS region II, and a second doped layer is formed over the second chemical oxide layer (S2005). FIG. 13 illustrates a corresponding structure.

As shown in FIG. 13, a second chemical oxide layer 207 may be formed on the sidewall of a fin structure 202 in the NMOS region II.

In one embodiment, the second chemical oxide layer 207 may be on the substrate 201 in the NMOS region II. The fabrication process and the material to form the second chemical oxide layer 207, and the effect of the second chemical oxide layer 27 may be referred to the previous embodiment and are not repeated herein. In one embodiment, the second chemical oxide layer 207 may be made of silicon oxide. The thickness of the second chemical oxide layer 207 may range from about 0.5 nm to about 3 nm.

Referring to FIG. 13, a second doped layer 208 may be formed on the second chemical oxide layer 207.

In one embodiment, the second doped layer 208 may also be on the first capping layer 206 in the PMOS region I. The first capping layer 206 may separate the first doped layer 205 from the second doped layer 208.

The second doped layer 208 may be doped with P-type doping ions. The P-type doping ions in the second doped layer 208 in the NMOS region II may diffuse into a fin structure 202 in the NMOS region II and form a P-type anti-punch-through region in a fin structure 202 in the NMOS region II.

The source material to form the second doped layer 208 may include an oxygen source gas. The second doped layer 208 material may be made of an insulating material. In one embodiment, the second doped layer 208, doped with P-type doping ions, may be made of silicon oxide, silicon oxynitride, silicon oxycarbide, and/or silicon oxycarbonitride. In one embodiment, the second doped layer 208 may be made of silicon oxide doped with P-type doping ions. The P-type doping ions may include boron, gallium and/or indium. In one embodiment, the second doped layer 208 may be boron-doped silicon oxide. The boron concentration in the second doped layer 208 may be about 1E21 atom/cm$^3$ to about 5E22 atom/cm$^3$. In other embodiments, the concentration of the doping ions in the second doped layer 208 may be determined according to requirements of different fabrication processes.

In one embodiment, an atomic layer deposition process with in-situ doping may be used to form the second doped layer 208 so that the P-type doping ions in the second doped layer 208 may be uniformly distributed. The formed second doped layer 208 may have a strong ability to cover a step-shaped feature. The thickness of the second doped layer 208 may be desirably uniform such that the concentration of P-type doping ions, diffusing into various parts of a fin structure 202 in the NMOS region II, may be relatively uniform in various parts of the fin structure 202.

In the process to form the second doped layer 208, the second chemical oxide layer 207 may prevent a fin structure 202 from being exposed in the environment for forming the second doped layer 208. Thus, a natural-oxide-like layer may be prevented from being formed on a fin structure 202.

In one embodiment, the thickness of the second doped layer 208 may range from about 2 nm to about 10 nm. The thickness of the second doped layer 208 should not be limited by the embodiments of the present disclosure. In other various embodiments, the thickness of the second doped layer 208 may be determined according to different requirements of the fabrication processes.

Detailed description of the second capping layer 209 may be referred to the description in the previous embodiment and is not repeated herein. In one embodiment, to form an insulation layer with a desired filling ability and a processing window sufficiently large to subsequently form the insulation layer, the second capping layer 209 may not be too thick. The thickness of the second capping layer 209 may range from about 5 nm to about 15 nm.

Figure 14:
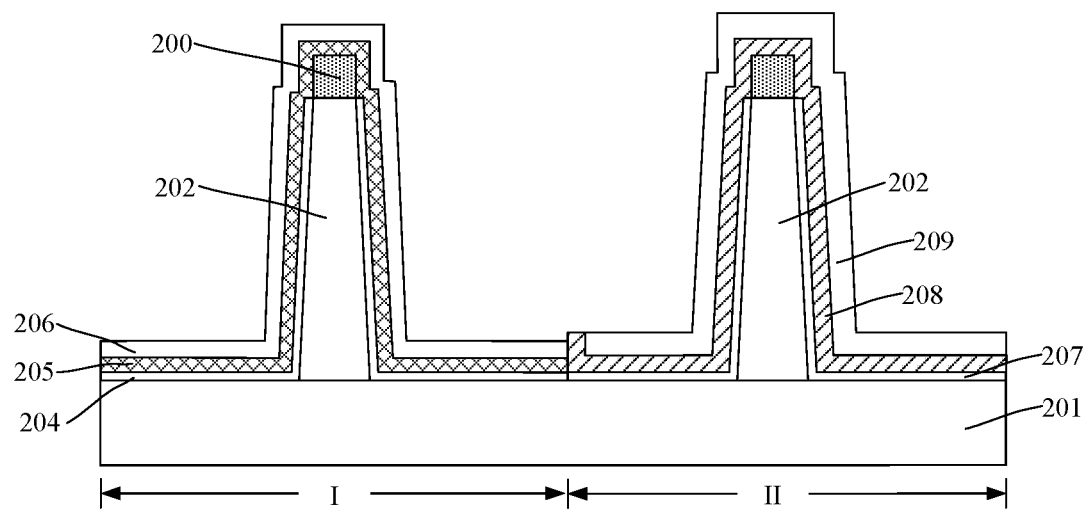

Referring to FIG. 20, after forming the second chemical oxide layer and the second doped layer, the second capping layer and the second doped layer in the PMOS region II are removed through an etching process (S2006). FIG. 14 illustrates a corresponding structure.

As shown in FIG. 14, the second capping layer 209 and the second doped layer 208 in the PMOS region I may be removed through an etching process.

Specifically, a second patterned layer may be formed on the second capping layer 209 in the NMOS region II. The second patterned layer may be used as a mask to etch and remove the second capping layer 209 and the second doped layer 208 in the PMOS region I. The second patterned layer may be further removed.

Because the first doped layer 205 and the second doped layer 208 are separated by the first capping layer 206, when the first capping layer 206 has a sufficiently strong blocking ability to prevent the doping ions in the first doped layer 205 and in the second doped layer 208 from diffusing into each other, in some embodiments, the second capping layer 209 and the second doped layer 208 in the PMOS region I may be retained or may not be removed. The cost of the semiconductor manufacturing to form the disclosed structure may be reduced.

The one embodiment, as an example, the first doped layer 205 may be formed first and the second doped layer 208 may be formed later. In some other embodiments, the second doped layer may be formed first and the first doped layer may be formed later. The specific order to form the first doped layer and the second doped layer should be determined according to different applications and/or designs and should not be limited by the embodiments of the present disclosure.

Figure 15:
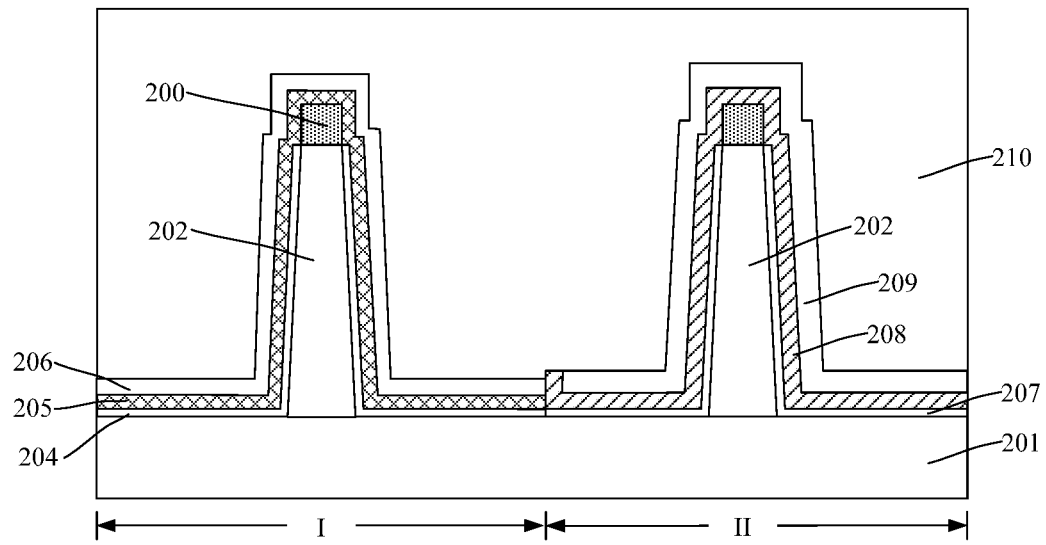

Referring to FIG. 20, after removing the second capping layer and the second doped layer in the PMOS region II, an insulation film is formed to fill up the space between adjacent fin structures, the top of the insulation film being higher than the top of the hard mask layer (S2007). FIG. 15 illustrates a corresponding structure.

As shown in FIG. 15, an insulation film 210 may be formed to fill up the space between adjacent fin structures 202. The top of the insulation film 210 may be higher than the top of the hard mask layer 200.

In one embodiment, the insulation film 210 may be formed on the first capping layer 206 in the PMOS region I and on the second capping layer 209 in the NMOS region II.

The insulation film 210 may provide fabrication base for forming the insulation structure of the subsequently formed fin-FET. The insulation film 210 may be made of an insulating material, e.g., silicon oxide, silicon nitride, silicon oxynitride, silicon oxycarbide, silicon carbonitride and/or silicon oxycarbonitride. In one embodiment, the insulation film 210 may be made of silicon oxide.

The openings filled by the insulation film 210 may each have a large depth-to-width ratio. To increase the gap-filling ability of the insulation film 210 and prevent the formation of voids in the subsequently-formed insulation layer, so that the subsequently-formed insulation layer has desirably close contact with the first capping layer 206 and the second capping layer 209, a flowable chemical vapor deposition (FCVD) process may be used to form the insulation film 210.

Specifically, the parameters of the FCVD process may include the follows. The precursor materials may enter the reaction chamber, before the reaction, at a flow rate of about 100 sccm to about 3000 sccm. $O_3$ may enter the reaction chamber at a flow rate of about 20 sccm to about 1000 sccm. The pressure in the reaction chamber may range from about 0.1 T to about 10 T. The temperature in the reaction chamber may range from about 20° C. to about 150° C. In some embodiments, an inert gas such as Ar, He and/or Xe may also enter the reaction chamber. The flow rate of the inert gas may range from about 1000 sccm to about 10000 sccm.

In one embodiment, after forming the insulation film 210, the fabrication process to form the disclosed structure may further include performing an annealing curing treatment on the insulation film 210. The annealing curing treatment may be performed in oxygen. In the curing treatment, the chemical bonds in the insulation layer 210 may reconstruct. The numbers of Si—O bonds and O—Si—O bonds in the insulation film 210 may increase. Accordingly, the density of the insulation film 210 may be increased.

The first doped layer 205 may contain N-type doping ions and the second doped layer 208 may contain P-type doping ions. The insulation film 210 may have an undesirably low density and soft texture. If the temperature of the annealing curing treatment is too high, the N-type doping ions in the first doped layer 205 may diffuse into the insulation film 210 that has a low density and soft texture. Similarly, the P-type ions in the second doped layer 208 may diffuse into the insulation film 210 that has a low density and soft texture.

As such, in one embodiment, the temperature of the annealing curing treatment may be desirably, e.g., from about 350° C. to about 650° C. After the annealing curing treatment, the density of the insulation film 210 may be increased. Further, in the annealing curing treatment, the N-type doping ions in the first doped layer 205 may not diffuse into the insulation film 210, and the P-type doping ions in the second doped layer 208 may not diffuse into the insulation film 210.

Figure 16:
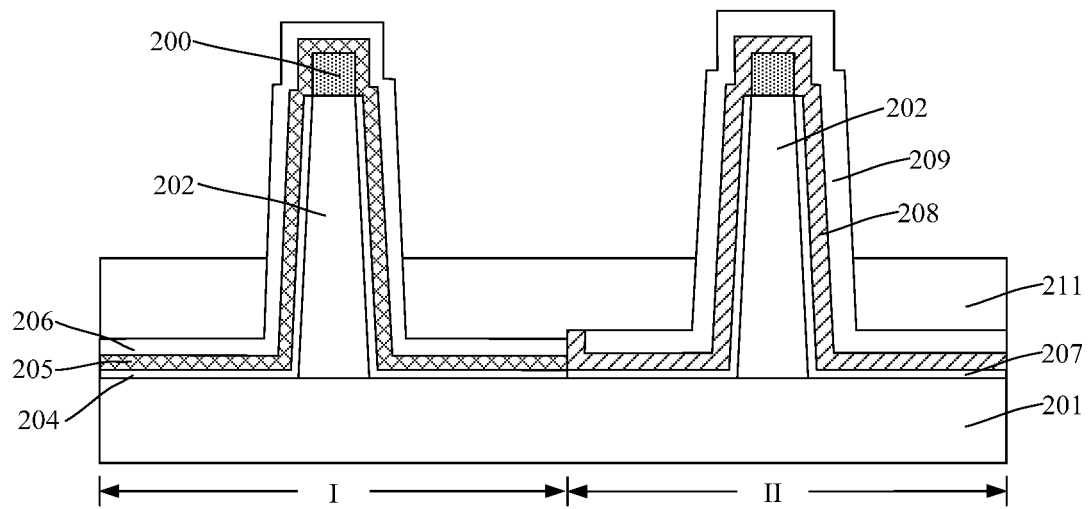

Referring to FIG. 20, after forming the insulation film, the insulation film is planarized and etched back to remove a partial thickness of the insulation film, to form an insulation layer (S2008). FIG. 16 illustrates a corresponding structure.

As shown in FIG. 16, the insulation film 210 (refer to FIG. 15) may be planarized and etched back to remove a partial thickness of the insulation film 210, to form the insulation layer 211.

Specifically, a chemical mechanical polishing process may be performed to remove the portion of the insulation film 210 over the hard mask layer 200, and remove the portion of the first doped layer 205 and the second doped layer 208 higher than the top of a hard mask layer 200.

A dry etching process, a wet etching process, and/or a combination of a dry etching process and a wet etching process may be used to etch and remove a partial thickness of the insulation film 210.

In some other embodiments, the hard mask layer 200 may be removed before etching back a partial thickness of the insulation film 210.

Figure 17:
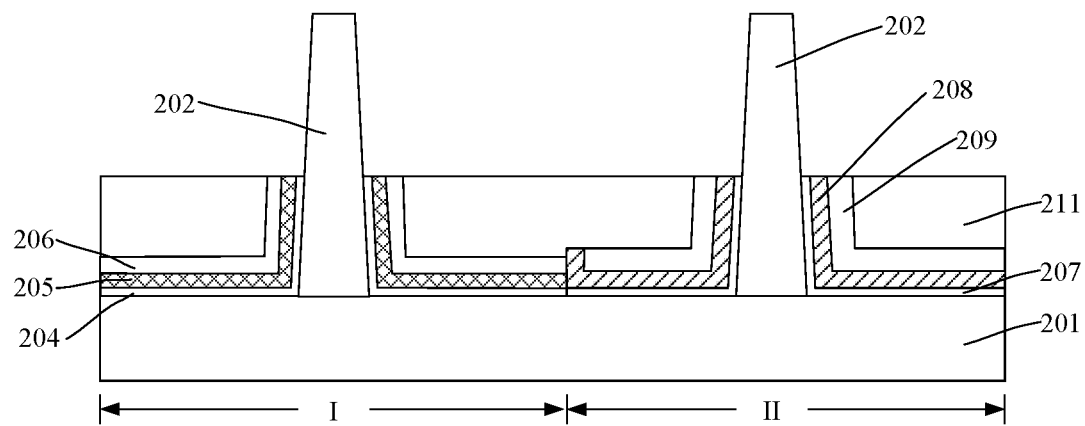

Referring to FIG. 20, after forming the insulation layer 211, portions of the doped layers higher than the insulation layer are removed (S2009). FIG. 17 illustrates a corresponding structure.

As shown in FIG. 17, portions of the doped layers higher than the insulation layer 211 may be removed.

Specifically, the first capping layer 206, the first doped layer 205, the second capping layer 209, and the second doped layer 208, higher than the insulation layer 211, may be removed through an etching process. Further, the hard mask layer 200 (referring to FIG. 16) may be removed through an etching process.

Figure 18:
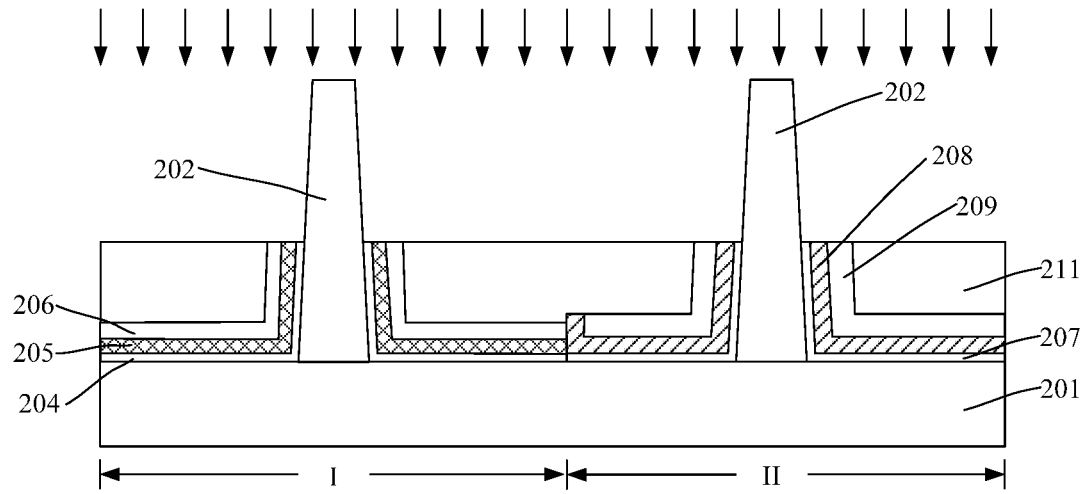

Referring to FIG. 20, after the portions of the doped layers higher than the insulation layer are removed, an annealing treatment is performed on the doped layers such that doping ions in the doped layers diffuse into a fin structure to form a doped region (S2010). FIG. 18 illustrates a corresponding structure.

As shown in FIG. 18, an annealing treatment is performed on the doped layers such that doping ions in the doped layers diffuse into a fin structure 202 to form a doped region.

In one embodiment, the doped regions may include an N-type anti-punch-through region (not shown) in a fin structure 202 in the PMOS region I, and a P-type anti-punch-through region (not shown) in a fin structure 202 in the NMOS region II. Specifically, in a same annealing treatment/process, the N-type doping ions in the first doped layer 205 in the insulation layer 211 may diffuse into a fin structure 202 in the PMOS region I to forming an N-type anti-punch-through region, and the P-type doping ions in the second doped layer 208 in the insulation layer 211 may diffuse into a fin structure 202 in the NMOS region II to form a P-type anti-punch-through region.

In one embodiment, a rapid thermal annealing process may be used for the annealing treatment. The annealing temperature may range from about 1000° C. to about 1150° C. The annealing time may range from about 1 second to about 10 seconds.

Because of the blocking effect of the first chemical oxide layer 204 and the second chemical oxide layer 207, no natural oxides may be formed on the fin structures 202 in the PMOS region I and NMOS region II. Thus, the N-type doping ions in the first doped layer 205 can easily diffuse into a fin structure 202 in the PMOS region I through the first chemical oxide layer 204, and the P-type doping ions in the second doped layer 208 can easily diffuse into a fin structure 202 in the NMOS region II through the second chemical oxide layer 207. Further, compared to the blocking ability of a natural oxide layer to P-type doping ions or N-type doping ions, the first chemical oxide layer 204 may have a weaker blocking ability to N-type doping ions, and the second chemical oxide layer 207 may have a lower blocking ability to P-type doping ions. Thus, the performance of the diffusion interface between the first doped layer 205 and a fin structure 202 in the PMOS regions I may be improved, and the performance of the diffusion interface between the second doped layer 208 and a fin structure 202 in the NMOS region II may be improved.

In summary, compared to conventional technology, the N-type doping ions in the disclosed embodiments may more easily diffuse into a fin structure 202 in the PMOS region I, so that the concentration of doping ions in the N-type anti-punch-through region can be closer to the targeted concentration. The N-type anti-punch-through region and the subsequently-formed source region or drain region in a fin structure 202 in the PMOS region I may form a PN junction, which may more effectively improve the reverse isolation ability of the N-type anti-punch-through region. Punch-throughs between the source region and the drain region in a fin structure 202 in the PMOS region I may be further prevented. Similarly, the P-type doping ions in the disclosed embodiments may more easily diffuse into a fin structure 202 in the NMOS region II, so that the concentration of doping ions in the P-type anti-punch-through region can be closer to the targeted concentration. The P-type anti-punch-through region and the subsequently-formed source region or drain region in a fin structure 202 in the NMOS region II may form a PN junction, which may more effectively improve the reverse isolation ability of the P-type anti-punch-through region. Punch-throughs between the source region and the drain region in a fin structure 202 in the NMOS region II may be further prevented.

The types of the doped regions in the fin structures should not be limited by the embodiments of the present disclosure.

In various other embodiments, a formed doped region may also be, e.g., a threshold voltage adjusting region.

The above detailed descriptions only illustrate certain exemplary embodiments of the present invention, and are not intended to limit the scope of the present invention. Those skilled in the art can understand the specification as whole and technical features in the various embodiments may be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor (fin-FET), comprising:
    providing a substrate having a plurality of discrete fin structures thereon;
    forming an insulation layer on the substrate to cover a lower portion of a sidewall of a fin structure, a top of the insulation layer being lower than a top of the fin structure;
    forming a chemical oxide layer on a top of the fin structure and an upper portion of the sidewall of the fin structure that is higher than the top of the insulation layer;
    forming a doped layer containing doping ions on the chemical oxide layer;
    annealing the doped layer such that the doping ions diffuse into the fin structure to form a doped region; and
    forming a gate structure laterally across a fin structure, the doped region being a lightly doped region in the fin structure on two sides of the gate structure, wherein:
    when the doped region is an N-type doped region, the doped region is made of N-type doped silicon oxide; and
    when the doping region is a P-type doped region, the doped region is made of P-type doped silicon oxide.

2. The method according to claim 1, wherein:
    the chemical oxide layer is formed through a chemical oxidation process; and
    the chemical oxide layer is made of silicon oxide.

3. The method according to claim 1, wherein:
    a thickness of the chemical oxide layer ranges from about 0.5 nm to about 3 nm.

4. The method according to claim 1, before the annealing, further comprising: forming a capping layer on the doped layer, wherein a material density of the capping layer is higher than a material density of the doped layer.

5. The method according to claim 1, wherein a source material to form the doped layer in the fin structure includes an oxygen source gas.

6. The method according to claim 1, wherein the doped layer includes one of an N-typed doped silicon dioxide and P-type doped silicon oxide and is formed through an atomic layer deposition process with in-situ doping.

7. The method according to claim 1, wherein the doped region is an anti-punch-through region, wherein:
    when the doped region in the fin structure is an N-type anti-punch-through region, the doped layer is made of N-type doped silicon oxide; and
    when the doped region in the fin structure is a P-type anti-punch-through region, the doped layer is made of P-type doped silicon oxide.

8. The method according to claim 1, wherein the doped region is a threshold voltage adjusting region.

9. A method for fabricating a fin field-effect transistor (fin-FET), comprising:

providing a substrate having a plurality of discrete fin structures thereon;

forming a chemical oxide layer on at least a sidewall of a fin structure;

forming a doped layer containing doping ions on the chemical oxide layer;

annealing the doped layer such that the doping ions diffuse into the fin structure to form a doped region; and forming a gate structure laterally across a fin structure, the doped region being a lightly doped region in the fin structure on two sides of the gate structure, wherein:

when the doped region is an N-type doped region, the doped region is made of N-type doped silicon oxide;

when the doping region is a P-type doped region, the doped region is made of P-type doped silicon oxide; and the substrate comprises a PMOS region and an NMOS region, each having one of the plurality of fin structures thereon, wherein:

the chemical oxide layer includes a first chemical oxide layer on the top and the sidewall of the fin structure in the PMOS region and a second chemical oxide layer on the top and the sidewall of the fin structure in the NMOS region;

the doped layer includes a first doped layer on the first chemical oxide layer and a second doped layer on the second chemical oxide layer, the first doped layer being doped with P-type doping ions and the second doped layer being doped with N-type doping ions; and the doped region includes a P-type doped region in the fin structure in the PMOS region and an N-type doped region in the fin structure in the NMOS region.

10. The method according to claim 9, wherein through a same annealing step, the P-type doping ions diffuse in to the fin structure in the PMOS region to forming the P-type doped region, and the N-type doping ions diffuse into the fin structure in the NMOS region to form the N-type doped region.

11. The method according to claim 10, wherein the annealing step is a rapid thermal annealing process, having an annealing temperature ranging from about 1000° C. to 1150° C. and an annealing time ranging from about 1 second to about 10 seconds.

12. The method according to claim 11, before the annealing step, further comprising:

forming an insulation layer over the doped layer such that the insulation layer fills up a space between adjacent fin structures and a top of the insulation layer is lower than a top of the fin structure; and removing a portion of the doped layer that is higher than the insulation layer.

13. The method according to claim 11, wherein the substrate comprises a PMOS region and an NMOS region, each having one of the plurality of fin structures thereon, and wherein:

the chemical oxide layer includes a first chemical oxide layer on the sidewall of the fin structure in the PMOS region and a second chemical oxide layer on the sidewall of the fin structure in the NMOS region;

the doped region includes a first doped layer on the first chemical oxide layer and a second doped layer on the second chemical oxide layer, the first doped layer being doped with N-type doping ions and the second doped layer being doped with P-type doping ions; and the doped region includes an N-type anti-punch-through region in the fin structure of the PMOS region and a P-type anti-punch-through region in the fin structure of the NMOS region.

14. The method according to claim 13, wherein forming the first chemical oxide layer, the second chemical oxide layer, the first doped layer, and the second doped layer comprises:

forming the first chemical oxide layer on the sidewalls the fin structures in the NMOS region and in the PMOS region;

forming the first doped layer on the first chemical oxide layer, the first doped layer being doped with N-type doping ions;

removing the first doped layer and the first chemical oxide layer in the NMOS region;

forming the second chemical oxide layer on the sidewall of the fin structure in the NMOS region;

forming the second doped layer on the second chemical oxide layer, the second chemical oxide layer being doped with P-type doping ions;

forming a first capping layer on the first doped layer and removing the first capping layer in the NMOS region before removing the first doped layer and first chemical oxide layer in the NMOS region, a material density of the first capping layer being higher than that a material density of the first doped layer; and forming a second capping layer on the second doped layer, a material density of the second capping layer being higher than a material density of the second doped layer and the second doped layer being on the first capping layer in the PMOS region.

15. The method according to claim 9, wherein forming the first chemical oxide layer, the second chemical oxide layer, the first doped layer, and the second doped layer comprises:

forming the first chemical oxide layer on the top and the sidewall of the fin structures in the NMOS region and in the PMOS region;

forming the first doped layer on the first chemical oxide layer, the first doped layer being doped with P-type doping ions;

removing the first doped layer and first chemical oxide layer in the NMOS region;

forming the second chemical oxide layer on the top and the sidewall of the fin structure in the NMOS region;

forming the second doped layer on the second chemical oxide layer, the second doped layer being doped with N-type doping ions;

forming a first capping layer on the first doped layer, and removing the first capping layer in the NMOS region before removing the first doped layer and the first chemical oxide layer in the NMOS region, a material density of the first capping layer being higher than a material density of the first doped layer; and forming a second capping layer on the second doped layer, the second doped layer being on the first capping layer in the PMOS region, and the material density of the second capping layer being larger than a material density of the second doped layer.

16. The method according to claim 9, wherein:

the chemical oxide layer is formed through a chemical oxidation process; and the chemical oxide layer is made of silicon oxide.

17. The method according to claim 9, wherein:

a thickness of the chemical oxide layer ranges from about 0.5 nm to about 3 nm.

18. The method according to claim 9, before the annealing, further comprising:

forming a capping layer on the doped layer, wherein a material density of the capping layer is higher than a material density of the doped layer.

19. The method according to claim 9, wherein a source material to form the doped layer in the fin structure includes an oxygen source gas.

* * * * *